(12) United States Patent
Nunan et al.

(10) Patent No.: US 7,820,527 B2
(45) Date of Patent: Oct. 26, 2010

(54) CLEAVE INITIATION USING VARYING ION IMPLANT DOSE

(75) Inventors: Peter Nunan, Monte Sereno, CA (US);
Steven R. Walther, Andover, MA (US);
Yuri Erokhin, Georgetown, MA (US);
Paul J. Sullivan, Wenham, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 372 days.

(21) Appl. No.: 12/119,170

(22) Filed: May 12, 2008

(65) Prior Publication Data
US 2009/0209084 A1 Aug. 20, 2009

Related U.S. Application Data

(60) Provisional application No. 61/030,044, filed on Feb. 20, 2008.

(51) Int. Cl.
*H01L 21/46* (2006.01)
(52) U.S. Cl. .................. 438/458; 438/428; 257/607; 257/617; 257/E21.568; 257/E21.57
(58) Field of Classification Search .................. 438/458
See application file for complete search history.

(56) References Cited

U.S. PATENT DOCUMENTS

| | | | | | |
|---|---|---|---|---|---|
| 4,449,051 | A | * | 5/1984 | Berkowitz | 250/492.2 |
| 5,374,564 | A | * | 12/1994 | Bruel | 438/455 |
| 5,877,070 | A | * | 3/1999 | Goesele et al. | 438/458 |
| 6,033,974 | A | * | 3/2000 | Henley et al. | 438/526 |
| 6,055,460 | A | * | 4/2000 | Shopbell | 700/121 |
| 6,184,111 | B1 | * | 2/2001 | Henley et al. | 438/514 |
| 6,248,649 | B1 | * | 6/2001 | Henley et al. | 438/515 |
| 6,290,804 | B1 | * | 9/2001 | Henley et al. | 156/344 |
| 6,291,313 | B1 | * | 9/2001 | Henley et al. | 438/458 |
| 6,291,326 | B1 | * | 9/2001 | Henley et al. | 438/526 |
| 6,372,609 | B1 | * | 4/2002 | Aga et al. | 438/459 |
| 6,396,191 | B1 | * | 5/2002 | Hagelstein et al. | 310/306 |
| 6,486,041 | B2 | * | 11/2002 | Henley et al. | 438/458 |
| 6,548,382 | B1 | * | 4/2003 | Henley et al. | 438/526 |
| 6,790,747 | B2 | * | 9/2004 | Henley et al. | 438/458 |
| 7,148,124 | B1 | * | 12/2006 | Usenko | 438/458 |
| 7,315,064 | B2 | * | 1/2008 | Mitani et al. | 257/347 |
| 7,326,628 | B2 | * | 2/2008 | Ben Mohamed et al. | 438/458 |
| 7,407,867 | B2 | * | 8/2008 | Ghyselen et al. | 438/455 |
| 7,544,957 | B2 | * | 6/2009 | Walther et al. | 250/492.21 |
| 7,666,758 | B2 | * | 2/2010 | Neyret | 438/458 |
| 2002/0127822 | A1 | * | 9/2002 | Ueyanagi et al. | 438/459 |
| 2002/0182827 | A1 | * | 12/2002 | Abe et al. | 438/455 |
| 2003/0077885 | A1 | * | 4/2003 | Aspar et al. | 438/517 |
| 2004/0060899 | A1 | * | 4/2004 | Waldhauer et al. | 216/2 |
| 2004/0077149 | A1 | * | 4/2004 | Renau | 438/308 |
| 2004/0110343 | A1 | * | 6/2004 | Machida et al. | 438/257 |

(Continued)

*Primary Examiner*—Fernando L Toledo
*Assistant Examiner*—Ankush k Singal

(57) ABSTRACT

An approach for providing a cleave initiation using a varying ion implant dose is described. In one embodiment, there is a method of forming a substrate. In this embodiment, a semiconductor material is provided and implanted with a spatially varying dose of one or more ion species. A handler substrate is attached to the implanted semiconductor material. A cleave of the implanted semiconductor material is initiated from the handler substrate at a preferential location that is a function of a dose gradient that develops from the spatially varying dose of one or more ion species implanted into the semiconductor material.

19 Claims, 6 Drawing Sheets

U.S. PATENT DOCUMENTS

| | | | |
|---|---|---|---|
| 2004/0175902 A1* | 9/2004 | Rayssac et al. | 438/459 |
| 2005/0026426 A1* | 2/2005 | Maleville et al. | 438/663 |
| 2005/0048738 A1* | 3/2005 | Shaheen et al. | 438/458 |
| 2005/0118349 A1* | 6/2005 | Whitehead et al. | 427/523 |
| 2006/0060943 A1* | 3/2006 | Ben Mohamed et al. | 257/607 |
| 2006/0177991 A1* | 8/2006 | Murakami et al. | 438/455 |
| 2006/0177993 A1* | 8/2006 | Endo et al. | 438/458 |
| 2006/0240651 A1* | 10/2006 | Renau et al. | 438/527 |
| 2007/0069335 A1* | 3/2007 | Endo et al. | 257/618 |
| 2007/0141740 A1* | 6/2007 | Theodore et al. | 438/40 |
| 2007/0224774 A1* | 9/2007 | Murakami et al. | 438/400 |
| 2008/0119028 A1* | 5/2008 | Akiyama et al. | 438/458 |
| 2009/0102008 A1* | 4/2009 | Kakehata | 257/506 |
| 2010/0087046 A1* | 4/2010 | Ohnuma | 438/458 |

\* cited by examiner

CLEAVE INITIATION USING VARYING ION IMPLANT DOSE

CROSS REFERENCE TO RELATED APPLICATIONS

This application claims the benefit of U.S. Provisional Application Ser. No. 61/030,044 filed on Feb. 20, 2008, and entitled "CLEAVE INITIATION USING VARYING ION IMPLANT DOSE," which is incorporated by reference herein in its entirety.

BACKGROUND

This disclosure relates generally to manufacturing substrates and more specifically to initiating a cleave of a substrate by using a varying ion implant dose.

A typical process for cleaving a substrate such as a semiconductor wafer involves implanting the substrate with a uniform dose of ions and thermally treating the implanted substrate with a thermal treatment. The thermal treatment of the implanted substrate causes a cleaving action to occur in a manner that is completely random and uncontrollable and may even occur at the substrate on multiple fronts. As a result, a film of material or multiple films of material may separate from the substrate at a random location and propagate in a random direction. This cleave process will produce undesirable results due to the random nature of the cleaving action. These undesirable results include potential problems such as an excessively rough surface finish on the surface of the material cleaved from the substrate due to non-uniformities that arise from the cleave and the potential for the cleaved material to have material properties that are substantially degraded.

SUMMARY

In a first embodiment, there is a method of forming a substrate. In this embodiment, the method comprises: providing a semiconductor material; implanting the semiconductor material with a spatially varying dose of one or more ion species; attaching the implanted semiconductor material to a handler substrate; and initiating a cleave of the implanted semiconductor material from the handler substrate at a preferential location that is a function of a dose gradient that develops from the spatially varying dose of one or more ion species implanted into the semiconductor material.

In a second embodiment, there is a method of forming a film of material. In this embodiment, the method comprises: providing a substrate; implanting the substrate with a non-uniform dose distribution of one or more ion species, wherein the non-uniform dose distribution defines a dose gradient that varies from a low dose gradient to a high dose gradient; attaching the substrate to a handler substrate; initiating a cleave of the substrate from the handler substrate at a region that comprises the high dose gradient; and propagating the cleave from the high dose gradient region in a direction towards another region comprising the low dose gradient to free a film of material from the substrate.

In a third embodiment, there is a method of initiating a cleave of a substrate. In this embodiment, the method comprises: providing a substrate; implanting the substrate with a spatially varying dose of one or more ion species; attaching the substrate to a handler substrate; and initiating a cleave at a region of the substrate from the handler substrate as a function of the spatially varying dose of one or more ion species.

In a fourth embodiment, there is a system for forming a film of material. In this embodiment, the system comprises: means for providing a substrate; means for implanting the substrate with a spatially varying dose of one or more ion species that defines a dose gradient that varies from a low dose gradient to a high dose gradient; means for attaching the substrate to a handler substrate; means for initiating a cleave of the substrate from the handler substrate at a region that comprises the high dose gradient; and means for propagating the cleave from the high dose gradient region in a direction towards another region that comprises the low dose gradient to free a film of material from the substrate.

DETAILED DESCRIPTION

Figure 1:
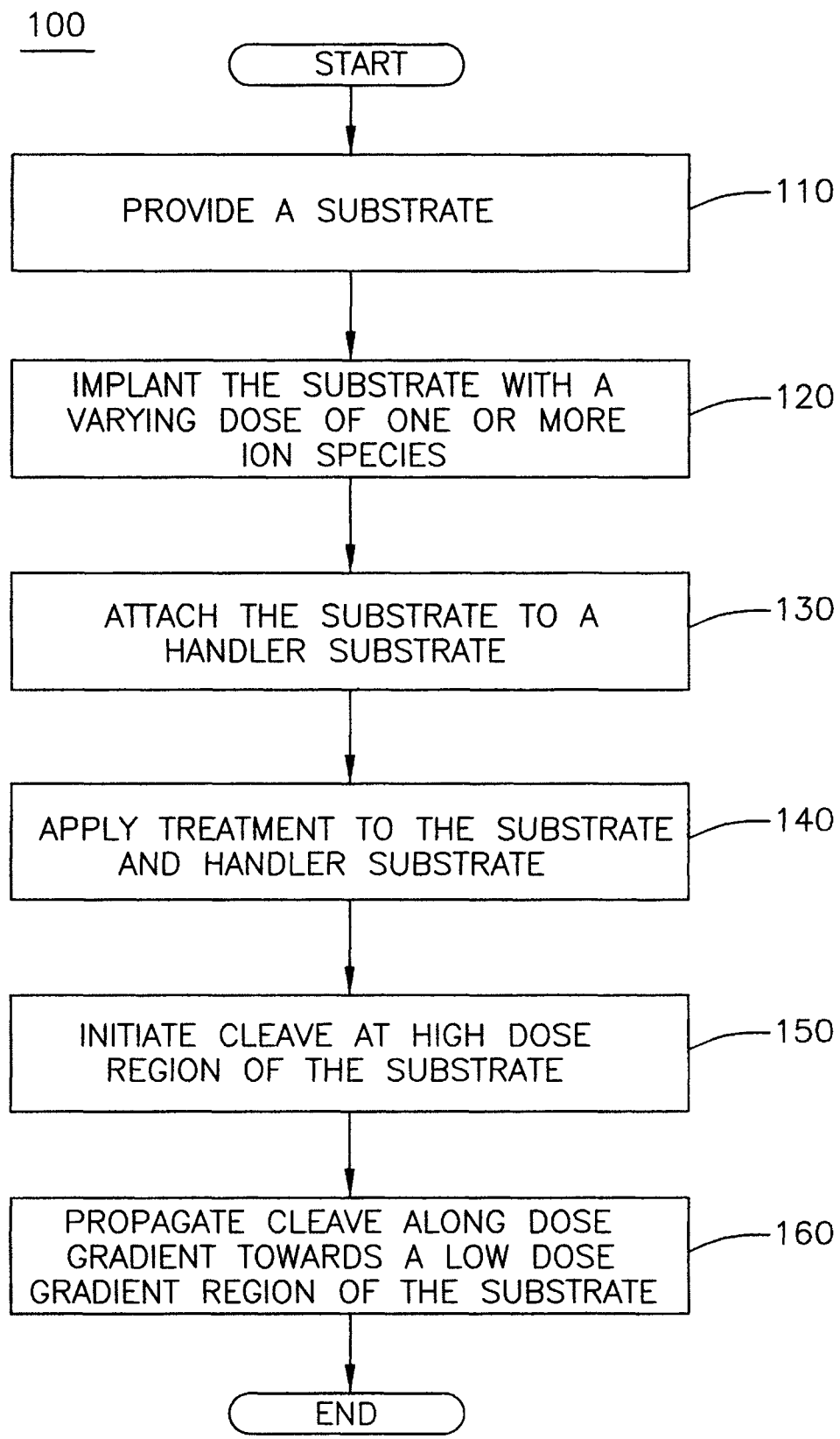
FIG. 1 shows a flow chart describing aspects of a method of forming a thin material from a substrate according to one embodiment of this disclosure.

FIG. 1 shows a flow chart describing aspects of a method 100 of forming a thin material from a substrate according to one embodiment of this disclosure. The method 100 of FIG. 1 begins at 110 where a substrate such as a semiconductor is provided. In one embodiment, the substrate may be any type of a substrate that is suitable for preparing a thin semiconductor material film including but not limited to silicon-on-insulator (SOI) substrates, three-dimensional integrated circuit stacked films, light-emitting-diode (LED) substrates, etc. In another embodiment, the substrate may be a silicon substrate such as a monocrystalline silicon, polycrystalline silicon or amorphous silicon that is suitable for use as solar cell substrates.

An ion flux is implanted into the substrate at 120. In particular, the substrate is implanted with a varying dose of one or more ion species. The ion implantation of the ion flux can occur via an ion implanter (e.g., a conventional beamline implanter, flood implanter, etc.), or a plasma implanter. Basically, any tool that can produce an energetic and strong enough ion flux that provides a varying dose of ions that results in a non-uniform dose distribution implanted in the substrate is suitable for use with the principles of this disclosure. Below are more details of an ion implanter and plasma implanter that can be used to implant a varying dose of ions into the substrate to produce a material that has a non-uniform dose distribution.

Note that each of the possible platforms noted above that can be used to implant an ion flux into the substrate will have a transport mechanism (e.g., a means for providing a substrate) for loading the substrate prior to implantation and removing the substrate after the implantation. In one embodiment, the transport mechanism may be a load lock that removes the substrate from a loading cassette or substrate holder and introduces it into a vacuum chamber for ion implantation. In particular, the transport mechanism will place the substrate in the chamber in the path of the ion flux such that the non-varying dose of ions hits the substrate, causing the ions to penetrate the surface of the substrate and come to rest beneath the surface at a certain depth. After completing the processing of the substrate, another transport mechanism will transport the substrate from the chamber.

Referring back to process block 120 of FIG. 1, the type of ion species that can be used to implant a non-uniform dose distribution in the substrate can be selected from a variety of different ions. In one embodiment, the one or more ion species can be hydrogen, helium, nitrogen, argon or combinations thereof. In one embodiment, implanting a high enough dose (e.g., 1E15-2E17 cm-2) of these ions into the substrate at an energy that ranges from about 20 keV to about 300 keV, while maintaining substrate temperature during ion implantation at less than 300 degrees Celsius (C.), causes the ions to penetrate a certain depth into the substrate and form bubbles. These bubbles are the media which results in a subsequent delamination or fracture of a film of material from the substrate.

After the substrate has been implanted with a non-uniform dose distribution of one or more ion species, then the substrate is attached to a handler substrate at 130. The handler substrate can be selected from a variety of possible substrates such as another substrate that includes but is not limited to a semiconductor or glass wafer. Those skilled in the art will recognize that other handler substrates are possible and the selection thereof will depend on the desired use of the implanted substrate. For example, if the desired use includes solar cells, then the handler substrate can include a non-silicon substrate such as glass, ceramic, plastic, silicon nitride (SiN) on metallurgical grade silicon, capped metal grade silicon (e.g., SiN on metal), etc.

The implanted substrate can be attached to the handler substrate in one of a number of well-known approaches. In one embodiment, the attaching of the implanted substrate to the handler substrate comprises well-known techniques of bonding or gluing. In the bonding embodiment, the implanted substrate may bond to the handler substrate via an adhesive layer that can include silicon dioxide as well as other suitable materials. The silicon dioxide layer may be grown or deposited onto the substrate in an earlier process step or in combination with the varying dose implant step.

Referring back to FIG. 1, the multi-layered structure of the implanted substrate attached to the handler substrate is treated at 140. The treatment may comprise one of a variety of treatments such as a mechanical treatment (e.g., ultrasound, polishing, etc.) or thermal treatment (e.g., annealing). Any one of these treatments will trigger delamination of a top layer (i.e., a film of material) from the implanted substrate. In addition to triggering delamination, these treatments aid in reducing surface roughness and passivating the surface (i.e., makes the surface cleaner and more stable).

The treatment in conjunction with the bubbles that form at a certain depth within the substrate result in the delamination of the film of material from the substrate. Referring to FIG. 1, the cleave is initiated at 150 at a high dose region of the substrate that has received a higher gradient of the ion dose from the varying ion dose supplied by the implanter. Using a varying ion dose that provides a non-uniform dose distribution in the substrate enables the control of the cleave, such that the cleave can be controlled to occur at preferential sites along the substrate. As mentioned before, a conventional cleave will provide a uniform distribution of a high ion dose to the substrate, but this will result in the cleave to occur at multiple fronts along the substrate. Because the implanter described herein is capable of providing non-uniform ion distributions, the location of the substrate that receives the high dose implant can be controlled to preferential sites. Thus, this approach is able to overcome the problems associated with cleaves occurring completely random at random locations.

In addition to controlling the location at which the cleave initiates, the non-uniform dose distribution enables one to control the direction in which the cleave propagates within the substrate. Referring back to FIG. 1, the cleave propagates at 160 along the dose gradient from the high dose gradient region towards a low dose gradient region of the substrate. As used herein, the high dose gradient region is the area of the substrate that has the highest concentration of ion dose and the low dose gradient region is the area of the substrate that has the lowest concentration of ion dose. Thus, the cleave propagates from a region in the substrate that has a high concentration of ion dose to a region that has a low concentration of ion dose. Because this approach is able to control the direction of the propagation of the cleave, this approach is able to overcome the problems associated with a conventional cleave process where the cleave propagates in a complete random direction or directions.

The foregoing flow chart shows some of the processing functions associated with forming a film of material from substrate using a cleave process. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added.

Figure 2A:
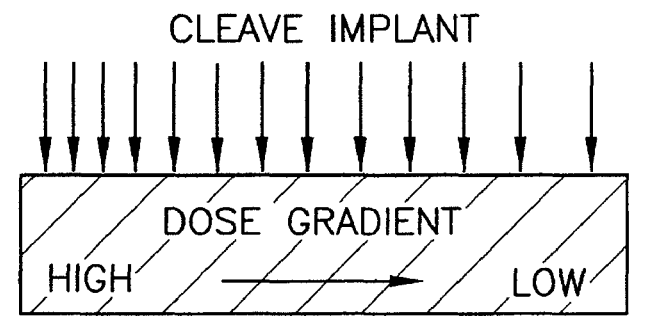
FIGS. 2A-2D shows a process flow of a thin material formed from a substrate in the manner described in FIG. 1 according to one embodiment of this disclosure.

FIGS. 2A-2D shows a process flow of a thin material from a substrate formed in the manner described in FIG. 1 according to one embodiment of this disclosure. In FIG. 2A, a substrate is implanted with a varying dose of one or more ion species that can include hydrogen, helium, nitrogen, argon or combinations thereof. These ions penetrate the surface of the substrate to a certain depth that will depend on the energy. As shown in FIG. 2A, the depth of penetration of the ions as indicated by the horizontal line running across the substrate. At this depth level, the ions will form the bubbles that result in a subsequent delamination or fracture of a film of material from the substrate. FIG. 2A also shows that the substrate receives a high dose of ions on the left hand side of the substrate as indicated by the more closely spaced arrows, while the right hand side of the substrate receives a low dose of ions as indicated by the more spaced arrows. As a result, the dose gradient is high on the left hand side of the substrate because of the high concentration of ions and the gradient gradually moves towards a low gradient on the right hand side of the substrate where the ion concentration is less.

Figure 2B:
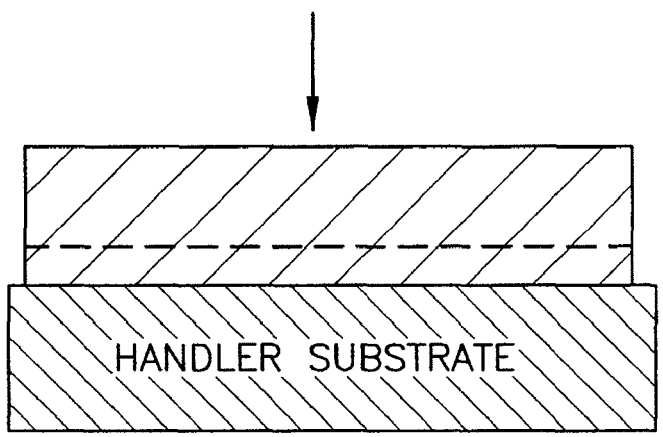

FIG. 2B shows the substrate attached to a handler substrate after it has been implanted with a non-uniform ion distribution. In particular, the substrate is attached to the handler substrate at the end of the substrate that is opposite of where the ion implant occurred. As mentioned above, the substrate is attached to the handler substrate via a well-known technique such as bonding or gluing.

Figure 2C:
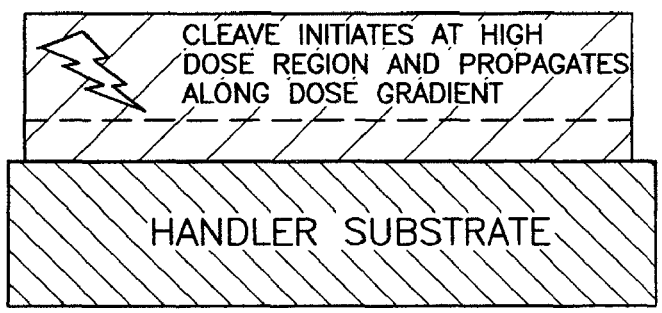
Figure 2D:
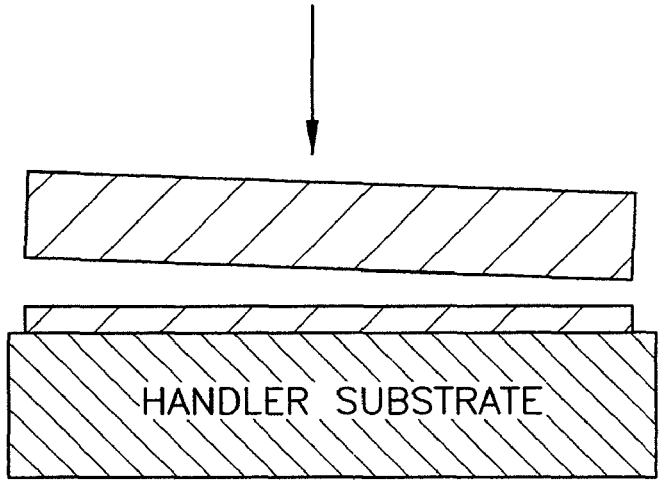

After treating the multi-layered structure of the substrate and the handler substrate, FIG. 2C shows that a cleave initiates at the high dose region of the substrate that has the higher gradient of the ion dose from the varying ion dose supplied by the implanter and propagates along the dose gradient towards the low dose gradient region of the substrate. Eventually as shown in FIG. 2D a film of material is fractured free from the substrate.

Figure 3:
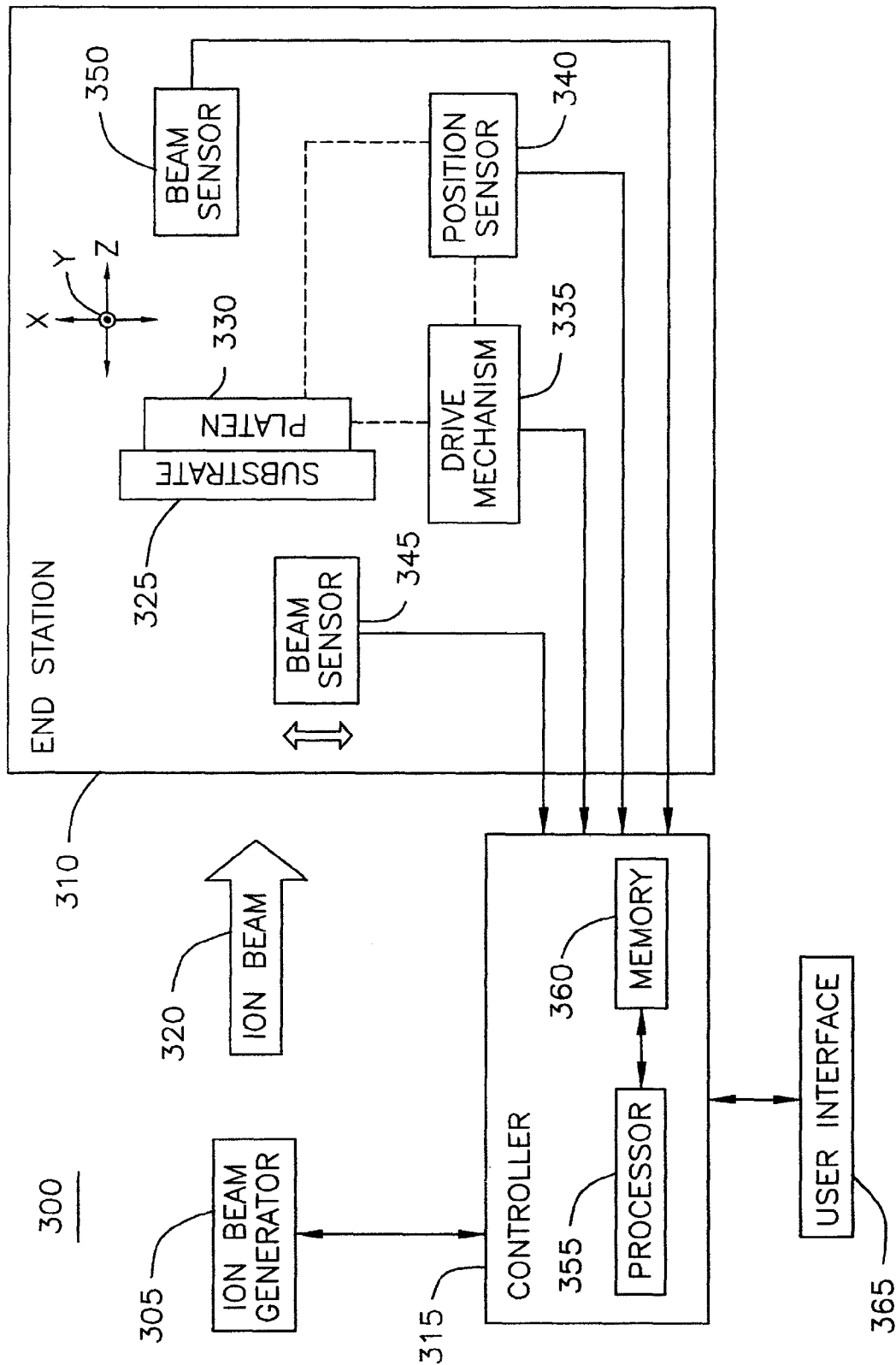
FIG. 3 shows a schematic block diagram of an ion implanter used in an aspect of forming the thin material from a substrate according to one embodiment of this disclosure.

FIG. 3 shows a schematic block diagram of an ion implanter 300 used in an aspect of forming the thin material from the substrate according to one embodiment of this disclosure. The ion implanter 300 can be an implanter such as a medium current implanter or a high current implanter that can include an ion beam generator 305, an end station 310, and a controller 315. The ion beam generator 305 generates an ion beam 320 and directs it towards a front surface of a substrate 325. The ion beam 320 is distributed over the front surface of the substrate 325 by beam scanning, substrate movement, or by any combination thereof.

The ion beam generator 305 can include various types of components and systems to generate the ion beam 320 having desired characteristics. The ion beam 320 may be a spot beam or a ribbon beam. The spot beam may have an irregular cross-sectional shape that may be approximately circular in one instance. In one embodiment, the spot beam may be a fixed or stationary spot beam without a scanner. Alternatively, the spot beam may be scanned by a scanner for providing a scanned ion beam. The ribbon beam may have a large width/height aspect ratio and may be at least as wide as the substrate or multiple substrates if multiple substrates are to be processed simultaneously. The ion beam 320 can be any type of charged particle beam such as an energetic ion beam used to implant the substrate 325.

The end station 310 may support one or more substrates in the path of the ion beam 320 such that ions of the desired species are implanted into the substrate 325. The substrate 325 may be supported by a platen 330.

The end station 310 may include a drive system (not illustrated) that physically moves the substrate 325 to and from the platen 330 from holding areas. The end station 310 may also include a drive mechanism 335 that drives the platen 330 and hence the substrate 325 in a desired way. The drive mechanism 335 may include servo drive motors, screw drive mechanisms, mechanical linkages, and any other components as are known in the art to drive the substrate 325 when clamped to the platen 330.

The end station 310 may also include a position sensor 340, which may be further coupled to the drive mechanism 335, to provide a sensor signal representative of the position of the substrate 325 relative to the ion beam 320. Although illustrated as a separate component, the position sensor 340 may be part of other systems such as the drive mechanism 335. Furthermore, the position sensor 340 may be any type of position sensor known in the art such as a position-encoding device. The position signal from the position sensor 340 may be provided to the controller 315.

The end station 310 may also include various beam sensors to sense the beam current density of the ion beam at various locations such as a beam sensor 345 upstream from the substrate 325 and a beam sensor 350 downstream from the substrate. As used herein, "upstream" and "downstream" are referenced in the direction of ion beam transport or the Z direction as defined by the X-Y-Z coordinate system of FIG. 3. Each beam sensor 345, 350 may contain a plurality of beam current sensors such as Faraday cups arranged to sense a beam current density distribution in a particular direction. The beam sensors 345, 350 may be driven in the X direction and placed in the beam line as needed.

Those skilled in the art will recognize that the ion implanter 300 may have additional components not shown in FIG. 3. For example, upstream of the substrate 325 there may be an extraction electrode that receives the ion beam from the ion beam generator 205 and accelerates the positively charged ions that form the beam, an analyzer magnet that receives the ion beam after positively charged ions have been extracted from the ion beam generator and accelerates and filters unwanted species from the beam, a mass slit that further limits the selection of species from the beam, electrostatic lenses that shape and focus the ion beam, and deceleration stages to manipulate the energy of the ion beam. Within the end station 310 it is possible that there are other sensors such as a beam angle sensor, charging sensor, position sensor, temperature sensor, local gas pressure sensor, residual gas analyzer (RGA), optical emission spectroscopy (OES), ionized species sensors such as a time of flight (TOF) sensor that may measure respective parameters.

The controller 315 may receive input data and instructions from any variety of systems and components of the ion implanter 300 and provide output signals to control the components of the implanter. The controller 315 can be or include a general-purpose computer or network of general-purpose computers that may be programmed to perform desired input/output functions. The controller 315 may include a processor 355 and memory 360. The processor 355 may include one or more processors known in the art. Memory 360 may include one or more computer-readable medium providing program code or computer instructions for use by or in connection with a computer system or any instruction execution system. For the purposes of this description, a computer readable medium can be any apparatus that can contain, store, communicate, propagate, or transport the program for use by or in connection with the computer, instruction execution system, apparatus, or device. The computer-readable medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include a compact disk-read only memory (CD-ROM), a compact disk-read/write (CD-R/W) and a digital video disc (DVD).

The controller 315 can also include other electronic circuitry or components, such as application specific integrated circuits, other hardwired or programmable electronic devices, discrete element circuits, etc. The controller 315 may also include communication devices.

A user interface system 365 may include, but not be limited to, devices such as touch screens, keyboards, user pointing devices, displays, printers, etc., that allow a user to input commands, data and/or monitor the ion implanter 300 via the controller 315.

Through its control capability, the implanter 300 is able to provide a varying dose of ions to the substrate 325 such that the implant results in the substrate having a non-uniform dose distribution. For example, the rate at which the substrate 325 is moved through the ion beam 320 can be used to affect the dose that the substrate receives. For instance, if the substrate 325 is moved rapidly through the ion beam 320, then the substrate will not receive a large amount of ions as opposed to if the substrate is moved slowly through the beam. In addition to the scan rate, the dose of ions can be increased or decreased by increasing or decreasing the amount of scans that the substrate receives, respectively. Also, the scan direction or the angle in which the substrate 325 is moved through the ion beam 320 can be used to obtain a non-uniform dose distribution.

Adjusting one of these parameters allows one to obtain a differing non-uniform dose distribution on the substrate 325 in a desired manner. For example, if it is desired to have more ions on the top of the substrate 325 as opposed to the bottom, then the substrate 325 is not transitioned through the ion beam 325 at a constant speed. As a result, more ions can strike the top of the substrate 325 than the bottom. Besides a top to bottom non-uniform dose distribution, it is also possible to obtain a non-uniform dose distribution that is distributed from edge to center or vice versa. For example, a center to edge non-uniform dose distribution can be obtained by rotating the substrate and increasing the scan rate in which the substrate 325 is exposed to the ion beam 320. In both examples, the controller 315 will receive feedback from the drive mechanism 335, position sensor 340, beam sensor 345 and beam sensor 350 to ensure that the desired non-uniform dose distribution is obtained.

Figure 4:
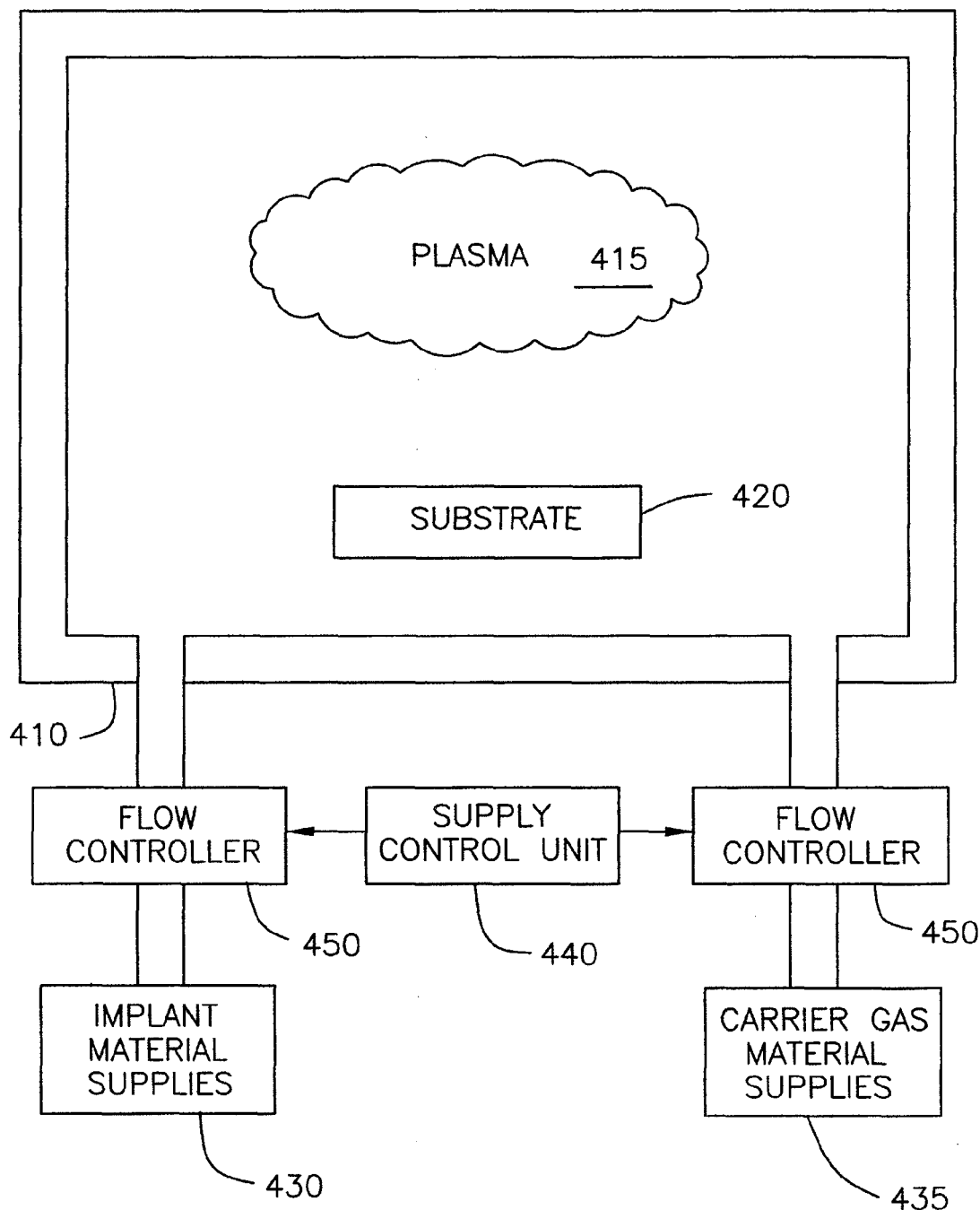
FIG. 4 shows a schematic block diagram of a plasma implanter used in an aspect of forming the thin material from a substrate according to one embodiment of this disclosure.

FIG. 4 shows a schematic block diagram of a plasma implanter 400 used in an aspect of forming the thin material from the substrate according to one embodiment of this disclosure. The plasma implanter 400 includes a vessel 410 associated with a chamber that can contain a plasma 415 and one or more substrates 420, which can be exposed to the plasma. The plasma implanter 400 also includes one or more implant material supplies 430, one or more carrier gas material supplies 435, flow controllers 450, and one or more supply control units 440. It also includes high voltage (10-120 KV) DC or pulsed power supply enabling acceleration of extracted ions prior to reaching surface of the implanted substrate.

The supplies 430, 435 supply materials to the vessel 410 for formation and maintenance of a plasma. The flow controllers 450 regulate the flow of materials from the supplies 430, 435 to control, for example, the pressure of gaseous material delivered to the vessel 410. The supply control unit 440 is configured to control, for example, a mixture of carrier gas supplied to the vessel 410 by communicating with the flow controllers 450. The material supplies 430, 435, flow controllers 450, and control units 440 can be of any suitable kind, including those known to one having ordinary skill in the plasma implant arts.

In one mode of operation, the plasma implanter 400 utilizes a pulsed plasma. A substrate 420 is placed on a conductive platen that functions as a cathode, and is located in the vessel 410. An ionizable gas containing, for example, an implant material, is introduced into the chamber, and a voltage pulse is applied between the platen and an anode to extract ions from plasma generated by an external source, such as an RF plasma generator or from a self-ignited glow discharge. An applied voltage pulse can cause ions in the plasma to cross the plasma sheath and to be implanted into the substrate. A voltage applied between the substrate and the anode can be used to control the depth of implantation. The voltage can be ramped in a process to achieve a desirable depth profile. With a constant doping voltage, the implant will have a tight depth profile. With a modulation of doping voltage, e.g., a ramp of doping voltage, the implant can be distributed throughput the thin-film, and can provide effective passivation to defect sites at variable depths.

The use of an ion implanter and a plasma implanter is beneficial in providing a non-uniform dose distribution to the substrate in order to facilitate cleaving of a thin-film of material from the substrate that is not subject to random cleave initiation sites and random cleave propagation directions. In particular, the unique control features that the ion implanter and plasma implanter provide can result in an implant that has a non-uniform dose distribution. More specifically, use of an ion implanter and a plasma implanter enables a precise adjustment of dopant level, dopant depth profile by ion dosage, ion energy, scan rate and angular control (scan direction) if necessary; that all can be used to obtain the desired cleaving effect for desired levels of thickness that is not subject to complete random cleave sites and random cleave propagation directions.

Figure 5A:
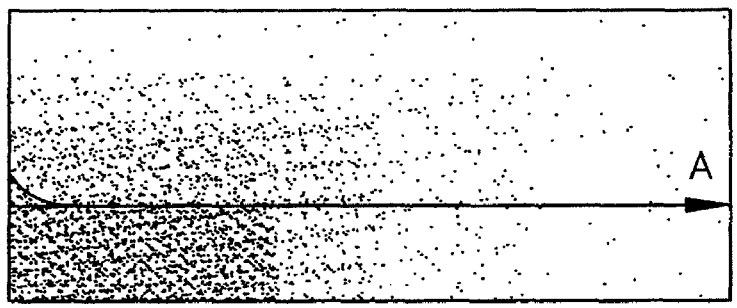
FIGS. 5A-5C shows schematic illustrations of a substrate implanted with a non-uniform ion dose distribution having a linear-shaped gradient according to one embodiment of this disclosure.
Figure 5B:
Figure 5C:
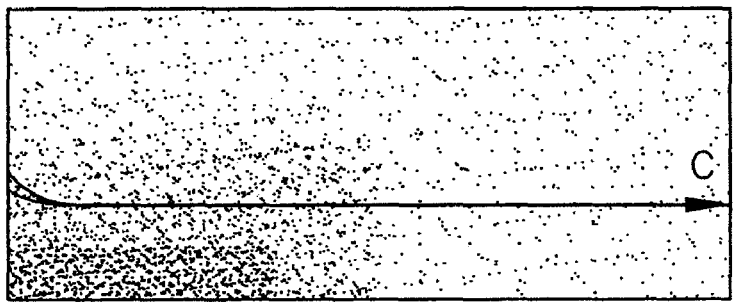

FIGS. 5A-5C shows schematic illustrations of a substrate implanted with a non-uniform ion dose distribution having a linear-shaped gradient according to one embodiment of this disclosure. In FIG. 5A, the substrate receives a high dose of ions using a single specie on the left hand side of the substrate at a designated location at the perimeter of substrate, while the right hand side of the substrate receives a low dose of ions as indicated by the less shaded area. By using a single specie of ions that are implanted with an increased dose at the perimeter of the substrate, one can define a preferential position for initiating a cleave of the substrate. In this embodiment, the dose gradient is linear-shaped (laterally-shaped) because the dose is high on the left hand side of the substrate and lower moving towards the right hand side of the substrate. Therefore, in this embodiment the cleave initiates at the high dose gradient region at the defined preferential position and propagates along the dose gradient from the high dose gradient region towards a low dose gradient region of the substrate. The propagation of the cleave is shown in FIG. 5A by line A.

In FIG. 5B, the substrate receives a high dose of ions using multiple species on the left hand side of the substrate at a designated location at the perimeter of substrate, while the right hand side of the substrate receives a low dose of ions as indicated by the less shaded area. In the embodiment shown in FIG. 5B, two species of ions are implanted, wherein one specie is implanted with an increased dose and another specie is implanted with a lower dose. By using multiple species of ions that are implanted in this manner, one can define a preferential position for initiating a cleave of the substrate, while maintaining thickness uniformity of a split or delaminated layer. Like FIG. 5A, the dose gradient in this embodiment is linear-shaped (laterally-shaped) because the dose is high on the left hand side of the substrate and lower moving towards the right hand side of the substrate. Therefore, in this embodiment the cleave initiates at the high dose gradient region at the defined preferential position and propagates along the dose gradient from the high dose gradient region towards a low dose gradient region of the substrate, resulting in a split layer having a uniform thickness. The propagation of the cleave is shown in FIG. 5B by line B.

The embodiment shown in FIG. 5C is similar to the one shown in FIG. 5B, except in this figure the two species of ions are implanted at an increased dose on the left hand side of the substrate at a designated location at the perimeter of substrate. This ion implantation also allows one to define a preferential position for initiating a cleave of the substrate, while maintaining thickness uniformity of a split or delaminated layer. Like FIGS. 5A-5B, the dose gradient in FIG. 5C is linear-shaped (laterally-shaped) because the dose is high on the left hand side of the substrate and lower moving towards the right hand side of the substrate. Likewise, in this embodiment the cleave initiates at the high dose gradient region at the defined preferential position and propagates along the dose gradient from the high dose gradient region towards a low dose gradient region of the substrate resulting in a split layer having a uniform thickness. The propagation of the cleave is shown in FIG. 5C by line C.

Figure 6:
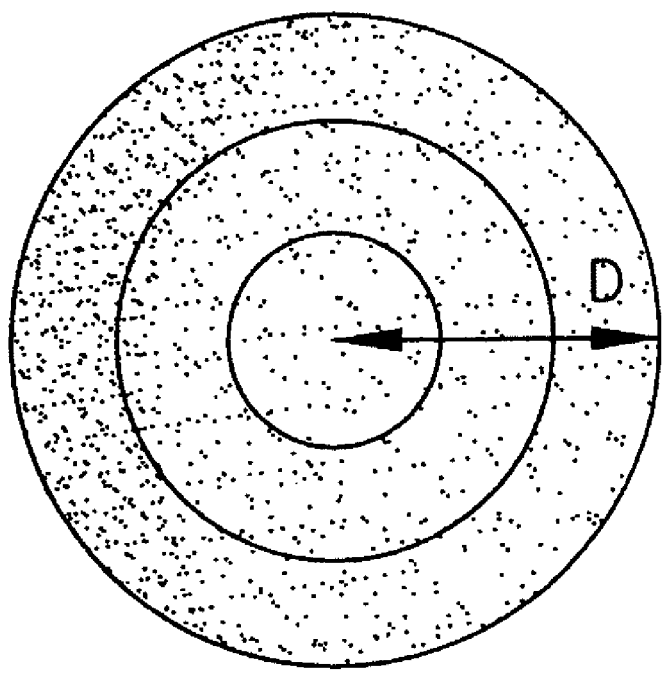
FIG. 6 shows a schematic illustration of a substrate implanted with a non-uniform ion dose distribution having a radially-shaped gradient according to another embodiment of this disclosure.

FIG. 6 shows a schematic illustration of a substrate implanted with a non-uniform ion dopant distribution according to another embodiment of this disclosure. In FIG. 6, the substrate is a semiconductor wafer that can receive a high dose of ions at either the center or the edge of the wafer. In this example, the edge of the wafer has a high dose concentration at the edge as indicated by the more shaded area, while the center of the wafer receives a low dose of ions as indicated by the less shaded area. As a result, the dose gradient is high at the edge of the wafer and low at center of the wafer. In this example, the dose gradient is a radially-shaped gradient that causes the cleave to initiate at the edge and propagate towards the center where the dose gradient is low. Although as illustrated by line D in FIG. 6, the dose gradient can be from the center to the edge of the wafer or from the edge to the center of the wafer.

It is apparent that there has been provided with this disclosure an approach for providing a cleave initiation using a varying ion implant dose. While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A method of forming a substrate, comprising:
   providing a semiconductor material;
   implanting the semiconductor material with a spatially varying dose of one or more ion species;
   attaching the implanted semiconductor material to a handler substrate; and
   initiating a cleave of the implanted semiconductor material from the handler substrate at a preferential location that is a function of a radially-shaped dose gradient that develops from the spatially varying dose of one or more ion species implanted into the semiconductor material.

2. The method according to claim 1, wherein the one or more ion species comprises hydrogen, helium, nitrogen, argon or combinations thereof.

3. The method according to claim 1, wherein the attaching of the implanted semiconductor material to the handler substrate comprises bonding or gluing.

4. The method according to claim 1, further comprising applying a treatment to the attached implanted semiconductor material and handler substrate.

5. The method according to claim 1, wherein the implanting comprises using an ion implanter or a plasma implanter.

6. The method according to claim 1, wherein the initiating of the cleave comprises effecting the cleave at an edge or center of the implanted semiconductor material and propagating the cleave along the direction of the radially-shaped dose gradient.

7. The method according to claim 1, wherein the implanting of the semiconductor material with the spatially varying dose of one or more ion species comprises adjusting a scan rate that the semiconductor material is moved through the one or more ion species.

8. The method according to claim 1, wherein the implanting of the semiconductor material with the spatially varying dose of one or more ion species comprises adjusting a scan direction in which the semiconductor material is moved through the one or more ion species.

9. A method of forming a film of material, comprising:
   providing a substrate;
   implanting the substrate with a non-uniform dose distribution of one or more ion species, wherein the non-uniform dose distribution defines a radially-shaped dose gradient that varies from a low dose gradient to a high dose gradient;
   attaching the substrate to a handler substrate;
   initiating a cleave of the substrate from the handler substrate at a region that comprises the high dose gradient; and
   propagating the cleave from the high dose gradient region in a direction towards another region comprising the low dose gradient to free a film of material from the substrate.

10. The method according to claim 9, wherein the one or more ion species comprises hydrogen, helium, nitrogen, argon or combinations thereof.

11. The method according to claim 9, wherein the attaching of the substrate to the handler substrate comprises bonding or gluing.

12. The method according to claim 9, further comprising applying a treatment to the attached substrate and handler substrate.

13. The method according to claim 9, wherein the implanting comprises using an ion implanter.

14. The method according to claim 9, wherein the implanting comprises using a plasma implanter.

15. The method according to claim 9, wherein the initiating of the cleave comprises effecting the cleave at a location near an edge or center of the substrate and the propagating of the cleave comprises continuing the cleave along the direction of the radially-shaped dose gradient from the high dose gradient region towards the low dose gradient region.

16. The method according to claim 9, wherein the implanting of the substrate with the non-uniform dose distribution of one or more ion species comprises adjusting a scan rate that the substrate is moved through the one or more ion species.

17. The method according to claim 9, wherein the implanting of the substrate with the non-uniform dose distribution of one or more ion species comprises adjusting a scan direction in which the substrate is moved through the one or more ion species.

18. A method of initiating a cleave of a substrate, comprising:
   providing a substrate;
   implanting the substrate with a radially-shaped spatially varying dose of one or more ion species;
   attaching the substrate to a handler substrate; and
   initiating a cleave at a region of the substrate from the handler substrate as a function of the radially-shaped spatially varying dose of one or more ion species.

19. A system for forming a film of material, comprising:
   means for providing a substrate;
   means for implanting the substrate with a radially-shaped spatially varying dose of one or more ion species that defines a dose gradient that varies from a low dose gradient to a high dose gradient;
   means for attaching the substrate to a handler substrate;
   means for initiating a cleave of the substrate from the handler substrate at a region that comprises the high dose gradient; and
   means for propagating the cleave from the high dose gradient region in a direction towards another region that comprises the low dose gradient to free a film of material from the substrate.

* * * * *